(12) United States Patent
Myung et al.

(10) Patent No.: US 11,391,783 B2
(45) Date of Patent: Jul. 19, 2022

(54) METHOD FOR DIAGNOSING STATE OF REUSE OF BATTERY

(71) Applicant: MINTECH CO., LTD., Daejeon (KR)

(72) Inventors: Hee Kyung Myung, Daejeon (KR); Jun Hee Lee, Cheonan (KR)

(73) Assignee: Mintech Co., Ltd., Daejeon (KR)

( * ) Notice: Subject to any disclaimer, the term of this patent is extended or adjusted under 35 U.S.C. 154(b) by 129 days.

(21) Appl. No.: 16/643,874

(22) PCT Filed: Sep. 5, 2018

(86) PCT No.: PCT/KR2018/010379
§ 371 (c)(1),
(2) Date: Mar. 3, 2020

(87) PCT Pub. No.: WO2019/050279
PCT Pub. Date: Mar. 14, 2019

(65) Prior Publication Data
US 2020/0249280 A1    Aug. 6, 2020

(30) Foreign Application Priority Data

Sep. 6, 2017 (KR) .......................... 10-2017-0113720

(51) Int. Cl.
*G06F 11/30* (2006.01)
*G01R 31/392* (2019.01)
*G01R 31/385* (2019.01)
*G01R 31/3835* (2019.01)
*G01R 31/374* (2019.01)
*H01M 10/42* (2006.01)

(52) U.S. Cl.
CPC ......... *G01R 31/392* (2019.01); *G01R 31/374* (2019.01); *G01R 31/385* (2019.01); *G01R 31/3835* (2019.01); *H01M 10/4285* (2013.01)

(58) Field of Classification Search
CPC .................................................... G01R 31/392
See application file for complete search history.

(56) References Cited

FOREIGN PATENT DOCUMENTS

| JP | 2013-140631 | * | 7/2013 |
| JP | 2013140631 A | | 7/2013 |
| JP | 2014020818 A | | 2/2014 |
| JP | 2017134894 A | | 8/2017 |
| KR | 20130066283 A | | 6/2013 |
| KR | 20150049557 A | | 5/2015 |

* cited by examiner

*Primary Examiner* — Phuong Huynh
(74) *Attorney, Agent, or Firm* — Rimon PC; Marc Kaufman

(57) ABSTRACT

Provided is a method for diagnosing a state of reusable (SOR) of a battery and, more specifically, to a method for diagnosing an SOR of a battery, the method being capable of diagnosing the overall state of a battery during battery reuse by separately diagnosing a state of health (SOH) and a state of power (SOP) of the battery.

The method for diagnosing a state of reusable (SOR) of a battery according to the present invention includes: estimating a state of charge (SOC) according to a change in an open circuit voltage (OCV); estimating a state of health (SOH) by using the SOC; calculating a state of power (SOP) in consideration of an output of a current battery; and calculating the SOR by using the SOH and the SOP.

2 Claims, 2 Drawing Sheets

FIG. 1
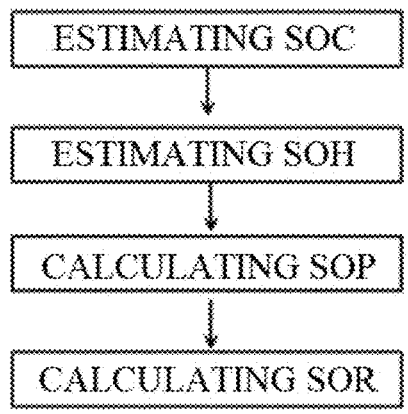
FIG.2
| OCV T SOC | 0 | 10 | 20 | 30 | 40 | 50 | 60 | 70 | 80 | 90 | 100 |
|---|---|---|---|---|---|---|---|---|---|---|---|
| 45°C | 295.4 | 338.2 | 345.7 | 357.4 | 365.5 | 370.0 | 374.5 | 382.6 | 387.4 | 390.8 | 398.1 |
| 25°C | 298.2 | 338.7 | 346.1 | 357.2 | 365.8 | 370.0 | 374.4 | 382.4 | 387.0 | 390.0 | 397.4 |
| 5°C | 296.9 | 339.3 | 346.7 | 358.2 | 366.2 | 370.0 | 374.3 | 382.2 | 386.9 | 389.3 | 397.3 |
FIG.3
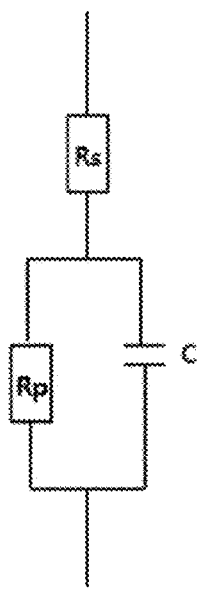

FIG.4.

| T \ SOC (Rp) | 0 | 10 | 20 | 30 | 40 | 50 | 60 | 70 | 80 | 90 | 100 |
|---|---|---|---|---|---|---|---|---|---|---|---|
| 45°C | 39.4 | 20.7 | 15.5 | 11.4 | 9.4 | 9.3 | 9.1 | 8.9 | 8.7 | 8.3 | 8.6 |
| 25°C | 100.3 | 52.6 | 38.5 | 29.1 | 33.8 | 28.6 | 33.3 | 22.7 | 22.1 | 21.0 | 28.3 |
| 5°C | 518.8 | 272.1 | 204.3 | 150.5 | 123.1 | 122.1 | 120.0 | 117.4 | 114.3 | 108.6 | 125.7 |

FIG.5

| T \ SOH (Rs) | 0 | 10 | 20 | 30 | 40 | 50 | 60 | 70 | 80 | 90 | 100 |
|---|---|---|---|---|---|---|---|---|---|---|---|
| 45°C | 226.8 | 208.3 | 193.4 | 178.6 | 161.8 | 146.9 | 132.1 | 117.2 | 102.4 | 84.7 | 72.8 |
| 25°C | 221.6 | 206.8 | 191.8 | 177.0 | 162.2 | 147.3 | 132.5 | 117.8 | 102.7 | 87.9 | 73.1 |
| 5°C | 330.2 | 281.9 | 255.1 | 228.3 | 204.7 | 181.6 | 159.4 | 138.4 | 118.6 | 106.3 | 85.9 |

METHOD FOR DIAGNOSING STATE OF REUSE OF BATTERY

BACKGROUND OF THE INVENTION

Field of the Invention

The present invention relates to a method for diagnosing a state of reusable of a battery, and more particularly, to a new concept method for diagnosing a state of reusable of a battery capable of diagnosing the state of reusable of a battery that is related to both a state of health and a state of power.

Related Art

A battery with electrical characteristics such as high ease of application and high energy density according to product family is also called a storage cell or a secondary battery, and is attracting attention as a new energy source for green and energy efficiency in that there are no by-products accompanied by energy use as well as the primary advantage of reducing the use of fossil fuel.

Therefore, a battery is commonly applied to an electric vehicle (EV), an energy storage system (ESS), and the like, which are driven by an electrical driving source, in addition to portable devices, and for more efficient battery management, research and development for a battery management system (BMS), a battery balancing circuit, a relay circuit, and the like is being actively conducted.

In particular, the BMS may manage a state of charging (SOC), a state of health (SOH), a maximum allowable amount of input/output power, an output voltage, and the like of a battery based on state information of a battery. Among those, a technology of estimating replacement time of a battery by estimating a service life of the battery has become a key technology for more stable system operation.

Recently, as the use of various devices, such as an electric vehicle, which use a battery, surges, interest and research on a technology of accurately estimating a state of health (SOH) of a battery using a battery management system (BMS) is rapidly increasing. When the SOH of the battery is incorrectly estimated, unexpected system shutdown may occur, or serious accidents such as fire or explosion due to overcharging or overdischarging of the battery may occur.

A secondary battery may lose a function as a secondary battery for abnormal use such as overdischarging or overcharging, but even when the secondary battery is used normally, capacity, which is an ability to store electrical energy, gradually decreases with a charge/discharge frequency. As a result, in order to meet the intended use, the secondary battery is used until the minimum function required as the secondary battery is lost according to the intended use, and when the minimum function is lost, the secondary battery is replaced with a new secondary battery and used. Typically, in the case of the electric vehicle, when the capacity of the secondary battery is reduced to 80% to 50% of initial capacity, the secondary battery is replaced.

The secondary battery is generally expensive, and the secondary battery replaced in this way often has the ability to store electrical energy for use in other applications even if the secondary battery does not meet the intended use of an electric vehicle. Therefore, rather than disposing the secondary battery replaced from the electric vehicle since the secondary battery is not suitable for use in the electric vehicle, recycling/reusing the secondary battery for other applications that require the energy storage capacity of the replaced secondary battery can not only prevent waste of resources, but also reduce manufacturing costs of the electric vehicle and other such devices.

However, the reusable capacity for determining whether the battery can be reusable or calculating how much the battery can be reusable for the reuse of the battery has not been known or studied in the past.

Related arts include Korean Patent No. 10-1399362 as a patent document and Korean Patent Laid-Open Publication No. 10-2010-0063343 as a patent document.

SUMMARY OF THE INVENTION

The present invention provides a new method for estimating a state of reusable of a battery in consideration of a state of power of the battery as well as a state of charging of the battery in order to solve the problem of clearly predicting the state of reusable of the battery in an environment requiring the reuse of the battery.

In an aspect, a method for diagnosing a state of reusable of a battery includes: estimating a state of charge (SOC) according to a change in an open circuit voltage (OCV); estimating a state of health (SOH); calculating a state of power (SOP); and calculating a state of reusable (SOR) by using the SOH and the SOP.

In the method for diagnosing a state of reusable of a battery according to the present invention, the state of reusable (SOR) means a reusable life when diagnosing, grading, and reusing the battery that is used and is then no longer used.

In the method for diagnosing a state of reusable of a battery according to the present invention, the state of reusable (SOR) is not simply determined by any one of the state of health (SOH) or the state of power (SOP) and is determined by establishing a predetermined relationship between the state of health (SOH) and the state of power (SOP).

In the method for diagnosing a state of reuse of a battery according to the present invention, the state of reusable (SOR) is represented by the following Equation 1.

$$SOR = a \times SOH + b \times SOP \qquad \text{<Equation 1>}$$

(Where $0 \le a \le 1$, $0 \le b \le 1$, and $a+b=1$ in the above Equation 1).

In the method for diagnosing a state of reusable of a battery according to the present invention, the state of power (SOP) is represented by the following Equation 2.

$$SOP = \left( \frac{V_0 - I_s \times (R_{s'} + R_{p'})}{V_0 - I_s \times (R_{s_0} + R_{p_0})} \right) \times 100 \qquad \text{<Equation 2>}$$

Here, Rso represents the Rs value when the SOH is 100% and the SOC is 50% at 25° C., $Rp_0$ represents the Rp value when the SOH is 100% and the SOC is 50% at 25° C., Rs' represents the Rs value when the current SOH value and the SOC are 50% at 25° C., Rp' represents the Rp value when the current SOH value and the SOC are 50% at 25° C., and Is represents a standard C rate current value.

BRIEF DESCRIPTION OF THE DRAWINGS

FIG. 1 is a diagram illustrating steps of a method for diagnosing a state of reusable of a battery according to the present invention.

FIG. 2 is a diagram illustrating OCV according to temperature-SOC.

FIG. 3 is a diagram illustrating a battery equivalent circuit according to the present invention.

FIG. 4 is a diagram illustrating Rp according to the temperature-SOC.

FIG. 5 is a diagram illustrating Rs according to the temperature-SOH.

DESCRIPTION OF EXEMPLARY EMBODIMENTS

Hereinafter, preferred embodiments of a method for diagnosing a state of reusable of a battery according to the present invention will be described in detail with reference to the accompanying drawings. Terms and words used below are not to be construed as a general or dictionary meaning but are to be construed as meaning and concepts meeting the technical ideas of the present invention based on a principle that the inventors can appropriately define the concepts of terms in order to describe their own inventions in best mode.

Referring to FIG. 1, a method for diagnosing a state of reusable of a battery according to the present invention may include estimating a state of charge (SOC) of a battery according to a change in an open circuit voltage (OCV); estimating a state of health (SOH) of the battery; calculating a state of power (SOP) of the battery; and calculating a a state of reusable (SOR) using the state of health (SOH) and the state of power (SOP).

In the method for diagnosing a state of reusable of a battery according to the present invention, the SOC means a state of charge and represents a usable capacity of the battery, that is, a state of charging as a percentage. That is, the SOC represents 100% in a full charge state and the SOC represents 0% in a minimum charge state.

In the method for diagnosing a state of reusable of a battery according to the present invention, the SOC is estimated according to the change in the OCV.

As an example of the relationship between the OCV and the
SOC, the following Equation has been known.

$$SOC = \alpha \times V_{OCV} + \beta$$

Here, α and β are values according to characteristics and temperature of a battery, respectively, and Vocv represents an open circuit voltage.

The relationship between the temperature, the OCV, and the SOC can be represented as a constant value through experimental measurements or mathematical equations. FIG. 2 illustrates the OCV according to the temperature-SOC. In FIG. 2, for example, it can be seen that the OCV becomes 370.0V when the SOC is 50% at 25° C.

In the method for diagnosing a state of reusable of a battery according to the present invention, the state of health (SOH) represents a degree of aging of a battery. The state of health (SOH) defines, as fresh, a state in which the battery is not fully aged, where the SOH is represented as 100%. On the contrary, a state in which the battery cannot be used due to aging is defined as Aged, and in this case, the SOH is represented as 0%. The state of health (SOH) compares the capacity of the battery in a fresh state with a battery capacity in an aged state to a certain degree, and is a value considering only a current capacity of a battery without other factors (for example, a voltage and the like of a device using a battery).

In the method for diagnosing a state of reusable of a battery according to the present invention, the state of health (SOH) may be represented by the following Equation.

$$SOH = \left( \frac{R', currentresistance}{R_i, initialresistance} \right)^{-1}$$

Here, a current resistance may represent a current value of an internal resistance, and an initial resistance may represent the initial value of the internal resistance.

Describing the related art, the SOH of the battery is estimated using a ratio of a current integration and an SOC variation of the battery. Conventionally, a method for measuring internal impedance has been used for diagnosing the state of charge (SOC) of the battery. As a method for diagnosing a state of health of a battery by measuring an internal impedance, there are an AC measuring method for measuring AC impedance, a DC measuring method for measuring DC resistance, and the like.

In the case of the AC measuring method having an AC voltage frequency of 1 kHz to 0.1 kHz, referring to FIG. 3, the internal impedance of the AC measuring method in the battery equivalent circuit may be represented as the following Equation.

$$Z = R_s + \frac{R_p}{(1 + jwC_pR_p)}$$

In the above Equation, Z represents the internal impedance of the battery, Cp represents the battery capacity, Rs represents an instantaneous internal resistance instantaneously dropping when measuring the OCV, and Rp is the internal resistance exponentially dropping in parallel with the capacitance (Cp). By the above Equation, the Rs, Rp, and Cp values can be obtained.

FIG. 4 illustrates the Rp according to the temperature-SOC. The relationship between the temperature, the SOC, and the Rp can be represented as a constant value through experimental measurements, mathematical equations, or the like. In FIG. 4, the Rp can be estimated through the SOC according to the temperature change. In FIG. 4, for example, it can be seen that the Rp becomes 23.6 mΩ when the SOC is 50% at 25° C.

FIG. 5 illustrates the Rs according to the temperature-SOC. Since the available capacity of the battery may decrease or the resistance may increase according to the temperature change or the used period of the battery, the state of health (SOH) may vary depending on the internal resistance Rs and the temperature of the battery. The relationship between the SOH and the Rs can be expressed through the experimental measurements, the mathematical equations, or the like. The Rs can be estimated through the relationship between the SOH and the Rs according to the temperature change as illustrated in FIG. 5. For example, referring to FIG. 5, it can be seen that the Rs becomes 73.0 mΩ when the SOH is 100% at 25° C.

In the method for diagnosing a state of reusable of a battery according to the present invention, in the calculating of the state of power (SOP), the state of power (SOP) indicating how much power the current battery can output is calculated by comparing the voltage of the battery in the fresh state with the voltage of the battery aged to a certain degree in consideration of the internal resistance of the battery.

In the method for diagnosing a state of reusable of a battery according to the present invention, the state of power (SOP) may be represented by the following <Equation 2>.

$$SOP = \left(\frac{V_0 - I_s \times (R_{s'} + R_{p'})}{V_0 - I_s \times (R_{s_0} + R_{p_0})}\right) \times 100 \qquad \text{<Equation 2>}$$

Here, Rso represents the Rs value when the SOH is 100% and the SOC is 50% at 25° C., $Rp_0$ represents the Rp value when the SOH is 100% and the SOC is 50% at 25° C., Rs' represents the Rs value when the current SOH value and the SOC are 50% at 25° C., Rp' represents the Rp value when the current SOH value and the SOC are 50% at 25° C., and Is represents a standard C rate current value.

In FIG. 4, the Rpo and the Rp' may be obtained, and in FIG. 5, the Rso and the Rs' may be obtained. For example, it can be seen that if the SOH is 80% at 25° C., in FIG. 4, the Rpo is 23.6 mΩ, in FIG. 5, the Rso is 73.0 mΩ, and the Rs' is 102.7 mΩ.

In the method for diagnosing a state of reusable of a battery according to the present invention, the state of reusable (SOR) is diagnosed in consideration of both the estimated state of health (SOH) and the calculated state of power (SOP).

Specifically, in the method for diagnosing a state of reusable of a battery according to the present invention, the state of reusable (SOR) may be represented by the following <Equation 1>.

SOR=a×SOH+b×SOP        <Equation 1>

(Where 0≤a≤1, 0≤b≤1, and a+b=1 in the above Equation 1).

In the method for diagnosing a state of reusable of a battery according to the present invention, the state of reusable (SOR) may be represented by characteristics of only the state of health (SOH) or the state of power (SOP) by setting values of a and b in the above Equation 1, and may be related to both the state of health (SOH) and the state of power (SOP).

For example, if the value of a is 1 and the value of b is 0, the state of reusable (SOR) is determined only by the state of health (SOH), and if the value of a is 0 and the value of b is 1, the state of reusable (SOR) is determined only by the state of power (SOP). In addition, when the value of a is 0.3 and the value of b is 0.7, the state of reusable (SOR) is determined by both the state of health and the state of power, and is determined by further weighting the state of power (SOP).

As a result, the method for diagnosing a state of reusable of a battery according to the present invention may set the state of reusable of a battery in consideration of the state of power (SOP) reflecting an output as well as the state of health (SOH) by setting the values of a and b.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

The method for diagnosing a state of reusable of a battery according to the present invention newly defines and calculates the state of reusable of the battery in consideration of both the state of health and the state of power of the battery, and thus can determine whether to reuse the battery so as to meet a user-planned life span.

What is claimed is:

1. A method for diagnosing a state of reusable of a battery, comprising:
    estimating a state of charge (SOC) according to a change in an open circuit voltage (OCV);
    estimating a state of health (SOH) by using the SOC;
    calculating a state of power (SOP) in consideration of an output of a current battery; and
    calculating a state of reusable (SOR) by using the SOH and the SOP,
    wherein the state of reusable (SOR) is represented by the following Equation 1,
    SOR=a×SOH+b×SOP        <Equation 1>
    In the above Equation 1, 0≤a≤1, 0≤b≤1, and a+b=1 whereby the calculated SOR can be used to determine whether to reuse the battery so as to meet a user-planned life span.

2. A method for diagnosing a state of reusable of a battery, comprising:
    estimating a state of charge (SOC) according to a change in an open circuit voltage (OCV);
    estimating a state of health (SOH) by using the SOC;
    calculating a state of power (SOP) in consideration of an output of a current battery; and
    calculating a state of reusable (SOR) by using the SOH and the SOP,
    wherein the state of power (SOP) is represented by the following Equation 2, $$SOP = \left(\frac{V_0 - I_s \times (R'_s + R'_p)}{V_0 - I_s \times (R_{s_d} + R_{P_d})}\right) \times 100 \qquad \text{<Equation 2>}$$

wherein
    Rso represents the Rs value when the SOH is 100% and the SOC is 50% at 25° C.,
    $Rp_0$ represents the Rp value when the SOH is 100% and the SOC is 50% at 25° C.
    Rs' represents the Rs value when the current SOH value and the SOC are 50% at 25° C.,
    Rp' represents the Rp value when the current SOH value and the SOC are 50% at a 25° C., and
    Is represents a standard C rate current value whereby the calculated SOR can be used to determine whether to reuse the battery so as to meet a user-planned life span.

* * * * *